United States Patent [19]

Sung

[11] Patent Number: 5,550,078
[45] Date of Patent: Aug. 27, 1996

[54] REDUCED MASK DRAM PROCESS

[75] Inventor: Janmye Sung, Tauyuan, Taiwan

[73] Assignee: Vanguard International Semiconductor Corp., Hsinchu, Taiwan

[21] Appl. No.: 496,015

[22] Filed: Jun. 28, 1995

[51] Int. Cl.⁶ .................... H01L 21/70; H01L 27/00
[52] U.S. Cl. .................... 437/52; 437/60; 437/919; 437/56
[58] Field of Search .................... 437/47–48, 52, 437/60, 919, 56–57; 257/306–310

[56] References Cited

U.S. PATENT DOCUMENTS

5,134,085  7/1992  Gilgen et al. .................... 437/52
5,252,504  10/1993 Lowrey et al. .................... 437/52
5,406,103  4/1995  Ogawa .................... 257/306
5,496,758  3/1996  Ema .................... 437/52

*Primary Examiner*—H. Jey Tsai
*Attorney, Agent, or Firm*—George O. Saile

[57] ABSTRACT

A process for fabricating stacked capacitor DRAM devices has been developed in which self aligned storage node contact structures, as well as bit line contact structures, are featured. A split polysilicon process has also been used to allow maskless source and drain ion implantation processing to be realized, thus reducing the number of photolithographic steps. A dual dielectric, interlevel insulator, is used to eliminate leakage between metal levels.

24 Claims, 8 Drawing Sheets

REDUCED MASK DRAM PROCESS

BACKGROUND OF THE INVENTION (1) Field of the Invention

The present invention relates to semiconductor devices, and more specifically to a process for fabricating high density, dynamic random access memory, (DRAM), devices (2) Description of Prior Art The major objective of the semiconductor industry, in producing DRAM devices, is to continually increase the density of the DRAM product, while still maintaining, or lowering the cost of these specific devices. The basic DRAM memory cell is usually comprised of a transfer gate transistor and a connected capacitor. Charges are stored in the capacitor section of the DRAM, and are accessed via the transfer gate transistor. The ability to densely pack storage cells, while still maintaining sufficient stored charge, is a function of the type and structure of the capacitor section of the DRAM. Two iterations of capacitors are presently being manufactured. A trench capacitor, in which charge is stored vertically in a structure fabricated by etching a deep trench in a substrate, has found use where high DRAM densities are desired. This type of capacitor, although eventually needed for the higher density DRAMS, is however costly to fabricate, regarding the trench etching, trench filling and planarization processing. A second type of capacitor used in the DRAM technology is the stacked capacitor cell, (STC). In this design two conductive layers, such as polycrystalline silicon, are placed over a section of the transfer gate transistor, with a dielectric layer sandwiched between the polycrystalline layers. The STC iteration has been used extensively in the industry, with emphasis placed on reducing the cost, while still increasing DRAM chip densities.

In order to successfully increase DRAM densities efforts have been directed to reducing specific device geometries. This has been accomplished via advantages in the photolithographic discipline, where more sophisticated exposure cameras, as well as the development of more sensitive photoresist materials, have allowed sub-micron chip features to be routinely achieved. Other semiconductor device fabrication disciplines, such as reactive ion etching, (RIE), as well as ion implantation, (I/I), and low pressure chemical vapor deposition, (LPCVD), have also contributed to the successful objective of decreasing specific device geomotries. However with the trend to more sophisticated semiconductor equipment and processes, the ability to maintain or reduce cost becomes more difficult.

The objective of cost reduction has been addressed by the DRAM industry in the form of mask reduction. That is attempting to fabricate the desired DRAM design, while using fewer, costly photolithographic steps. Gilgen, et al, in U.S. Pat. No. 5,134,085, describe a DRAM process in which significant reductions in photomasking steps have occurred. However they still show a "split polysilicon" process, in which the polysilicon used for the gate structure for P channel devices, is patterned using one photo step, while another photo step is needed to pattern the capacitor plate for the STC structure. This step occurred after fabrication of the polysilicon, n gates used for the N channel devices. The ability to fabricate the gate structures at different points of the process allowed for the creation of the lightly doped, as well as the more highly doped, source and drain regions to be obtained without the use of photolithographic processing, thus reducing the cost of the DRAM chip. This patent, though partially successsful in reducing photomasking steps compromises P channel performance by an intentional undercut of the polysilicon gate structure, designed to reduce source to gate overlap capacitance. However this undercut increases resistance and decreases the performance of the P channel device.

This invention will describe a DRAM process with a significant reduction in photolithographic steps, while still maintaining superior P channel performance. In addition this invention will describe a fabrication method used to obtain self aligned bit line, and storage node contacts, offering performance improvements.

SUMMARY OF THE INVENTION

It is an object of this invention to provide a process for fabricating stacked capacitor, dynamic randon access memory, (DRAM), devices, on a semiconductor substrate.

It is another object of this invention to use a split polysilicon process to reduce the total number of photolithographic masking steps, eliminating the lightly doped source and drain, and the n+ and p+ source and drain photomasking steps.

It is still another object of this invention to use the same photo step to perform the N channel to N channel isolation ion implantation step, while also adjusting the threshold voltage for the core memory N channel devices.

It is yet another object of this invention to fabricate the P channel gate structure and the capacitor plate using the same photo step.

It is still yet another object of this invention to use a self aligned bit contact structure, and a self aligned storage node structure, to improve device performance, with the bit line formation being performed either before or after the capacitor plate formation.

It is still yet another object of this invention to use a thin silicon nitride layer between interlevel dielectric layer 2, and second level metal, to improve yield and reliability of the DRAM device.

In accordance with this present invention a method is described for fabricating stacked capacitor, DRAM devices. A self aligned, twin, N well and P well, is formed via ion implantation, and driven in. Thick field oxide is grown to isolate the N well region from the P well region, followed by a blanket ion implantation step, performed for purposes of subsequently adjusting the threshold voltage of the N channel device. A core memory, N channel, threshold adjust ion implant is next performed to the opened P well region, which also serves a role in improving the N channel to N channel isolation. After photoresist removal and careful cleans, agate oxide is grown followed by deposition and doping of a polysilicon layer. After a thin oxide growth, on the polysilicon layer, a layer of phosphosilciate glass, (PSG), is deposited followed by photoresist patterning and a reactive ion etch, (RIE), step, resulting in the formation of N channel, polysilicon gate structures, on their well region, while the photoresist masking of the N well region, results in undisturbed blanket PSG-polysilicon layers. The lightly doped source and drain, (LDD), regions are then formed for the N channel devices by blanket ion implant, followed by deposition and blanket RIE to produce insulator, spacers on the N channel polysilicon, gate structures. The N channel source and drains are then formed, again using blanket ion implantation procedures.

Next the storage node structure is formed by; deposition of an insulator, masking to open the insulator in regions where the storage node contact is to be formed, deposition of the storage node polysilicon layer, masking and RIE to form the storage node contact structure in P well region. A thin composite dielectric, and a thin layer of amorphous silicon is next deposited, followed by photoresist masking and removal of the composite dielectric and amorphous silicon layers, in the N well region. The PSG layer is then removed from the blanket polysilicon layer, in the N well region, followed by another deposition of polysilicon and insulator. Photoresist and RIE processing are next performed to create the storage polysilicon of the capacitor structure, for the N channel region, while the game RIE process creates the P channel polysilicon gate structure in the N well region. A P channel LDD ion implant process, followed by the creation of an insulator spacer and the P channel source and drain regions, are next performed.

The bit line contact hole process is next performed by first depositing an insulator film, and then using photoresist and RIE processes to create the bit contact hole to the N+ source and drain areas in the P well regions. Bit line blanket metallization, followed by patterning using photoresist and RIE, are used to form the bit line contact structure. It should be noted that the bit line structure can be created before the storage node structure if desired.

A first interlevel dielectric is then deposited and planarized using chemical mechanical polishing, (CMP), followed by contact hole openings to the P channel source and drain regions. After contact metallization, and the formation of a first metal structure, a second interlevel dielectric is deposited, and planarized using CMP processing. A thin silicon nitride layer is next deposited, followed by via hole openings, and metal deposition and patterning to create the second metal structure Finally passivation, in the form of a thin insulator and polyimide, overly the second metal structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming stacked capacitor, DRAM, devices, will now be covered in detail. The DRAM device is fabricated using a complimentary metal oxide, (CMOS), field effect transistor approach. That is that both N type, field effect transistors, (NFET), as well as P type, field effect transistors, (PFET), are used on the same chip. The CMOS technology, used to fabricate the stacked capacitor DRAM devices described in this inventions, is now being manufactured in industry, therefore only the specific areas unique to understanding this invention will be desribed in detail.

Figure 1:
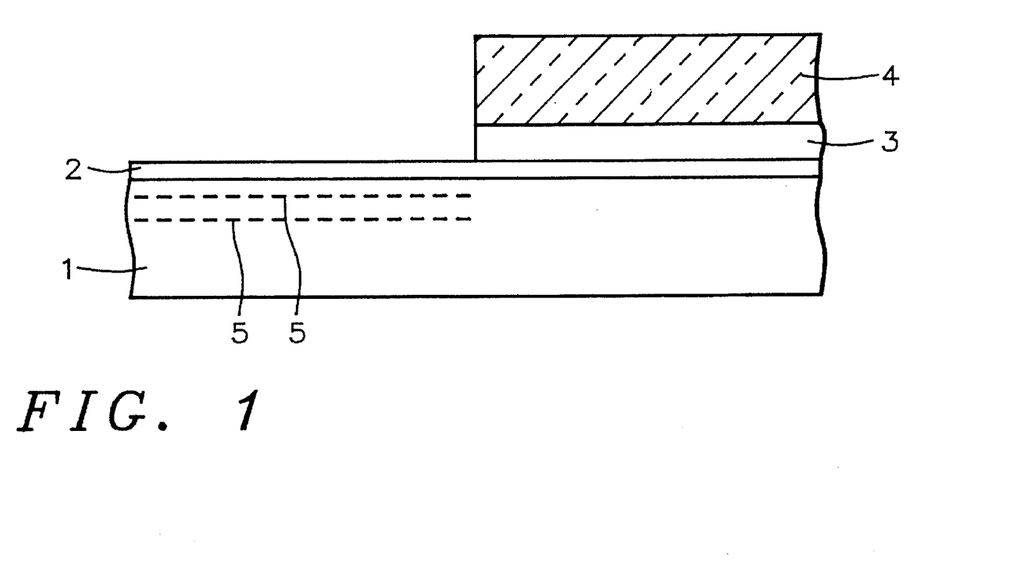
FIGS. 1–4, which schematically, in cross-sectional representation, describe the formation of the P and N well, as well as the isolation regions.
Figure 2:
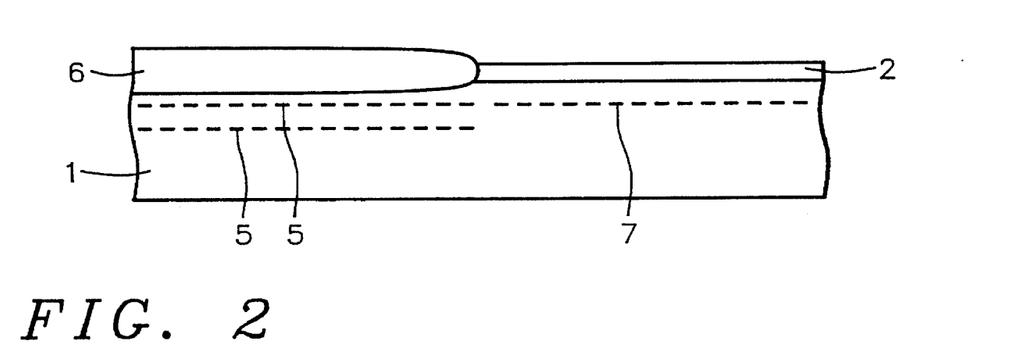
Figure 3:
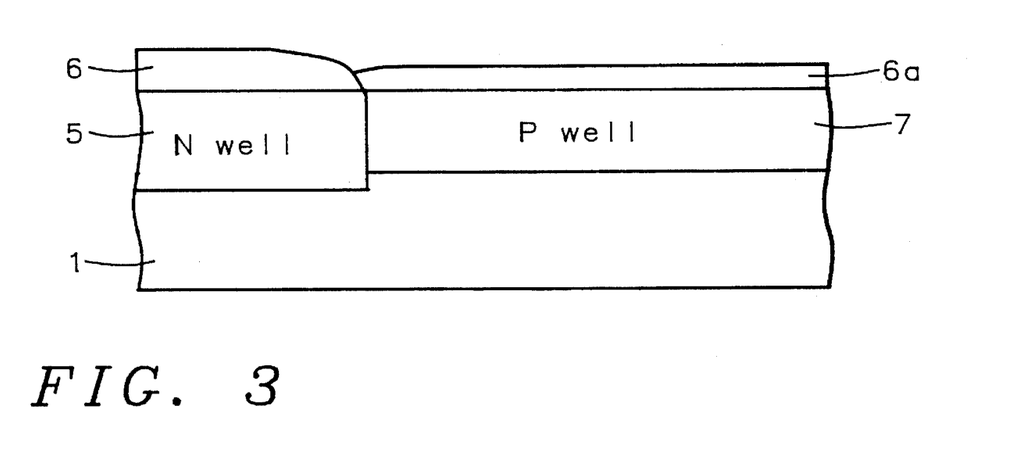

FIG. 1 shows a staring substrate, 1, composed of P type, single crystal silicon with a <100> orientation. A silicon oxide layer, 2, is grown at a temperature between about 800° to 1100° C., to a thickness between about 150 to 550 Angstroms, followed by a low pressure chemical vapor deposition, (LPCVD), of silicon nitride, 3, at a temperature between about 600° to 800° C., to a thickness between about 600 to 1500 Angstroms. A photoresist layer, 4, is used as a mask to allow removal of silicon nitride layer, 3, from the area of the substrate, that will be used for the N well region. The silicon nitride is removed using reactive ion etching, (RIE). The dopants needed to form the N well region, 5, are now supplied via ion implantation of aresenic, at an energy between about 50 to 180 Kev., and at a dose between about 1E11 to 1E13 atoms/cm2, and phosphorous, at an energy between about 100 to 400 Kev., at a dose between about 1E11 to 1E13 atoms/cm2. After photoresist removal, using oxygen plasma ashing, followed by careful wet chemical cleans, an oxidation is performed to result in a silicon dioxide layer, 6, between about 1500 to 2500 Angstroms, in region 5. The silicon nitride layer, 3, is then removed, using a hot phosphoric acid solution. This is schematically shown in FIG. 2. Also shown in FIG. 2 is the result of a ion implantation of boron, 7, for BF2, used for forming the P well region. The implant step is performed at an energy between about 10 to 100 Kev., at a dose between about 1E12 to 1E13 atoms/cm2. FIG. 3, shows the result of a drive-in, performed at a temperature between about 1025° to 1075° C., for a time between about 30 to 90 min., followed by an additional drive-in at a temperature between about 1125° to 1175° C., for a time between about 10 to 120 min. The drive-in results in the formation of P well region, 7, N well region, 5, as well as a growth of a silicon oxide layer 6a, on the surface of the P well region.

Figure 4:
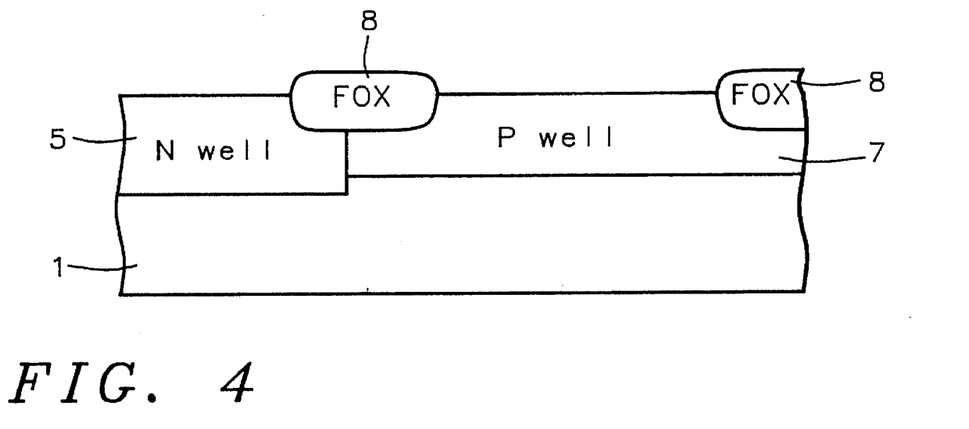
Figure 5:
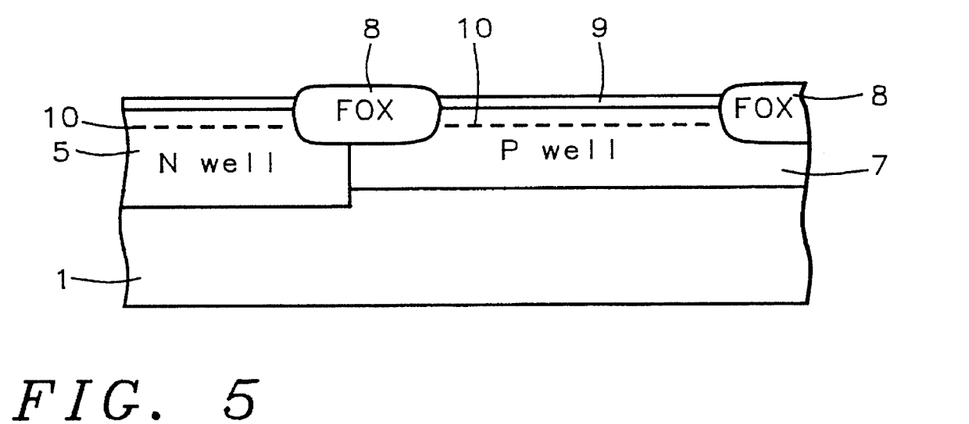
FIGS. 5–9, which schematically, in cross-sectional style, describe the fromation of the N channel polysilicon gate structure.
Figure 6:
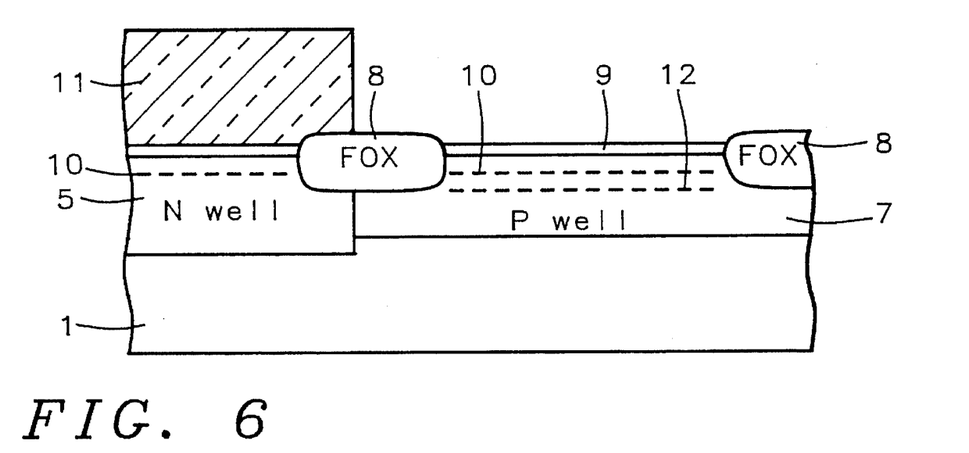

After removal of oxide layer, 6, and oxide layer 6a, via use a bufferd hydrofluoric acid solution, conventional isolation processing is applied to achieve the field oxide. (FOX), region, 8, illustarted in FIG. 4. Briefly the method used to form the FOX insulator is to use a thin thermal oxide, and a silicon nitride layer, as an oxidation mask. The desired FOX regions are etched open in the silicon nitride—silicon dioxide mask using conventional photolithographic techniques and dry etching processing. After removal of the masking photresist, and a chemical clean, a FOX region is grown, typically to a thickness of about 4000 to 7000 Angstroms. After removal of the oxidation mask, via wet processes such as hot phosphoric acid for the silicon nitride layer, and a buffered hydrofluoric acid for the thin thermal oxide, another wet chemical clean is performed, followed by the formation of a screen oxide, 9, grown as thermally oxidized silicon, at a temperature between about 850° to 950° C., to a thickness between about 150 to 250 Angstroms. This can be seen in FIG. 5. A blanket ion implantation of BF2, 10, is then performed, for purposes of adjusting the threshold voltage of a N channel device, (and/or the P channel device) that will be fabricated in the P well region. The implantation is performed at an energy between about 20 to 60 Kev., at a dose between about 1E11 to 1E12 atoms/cm2. An additional ion implantation step is next performed to adjust the N channel core memory, if two different threshold voltages for N channel devices is needed in a specific design. This step is only applied to the N channel region, so photoresist masking, 11, is used to block the N well region from a implantation, 12, of BF2, at an energy between about 20 to 60 Kev., at a dose between about 1E11 to 1E12 atoms/cm2. This is shown in FIG. 6.

Figure 7:
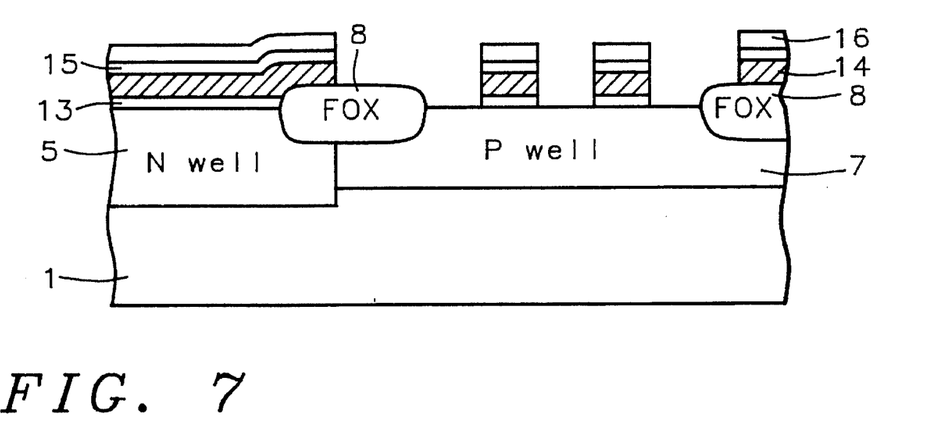
Figure 8:
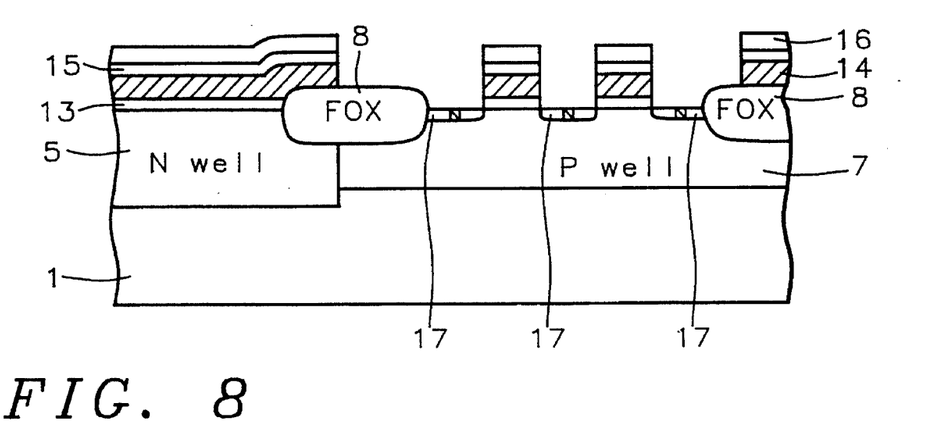
Figure 9:
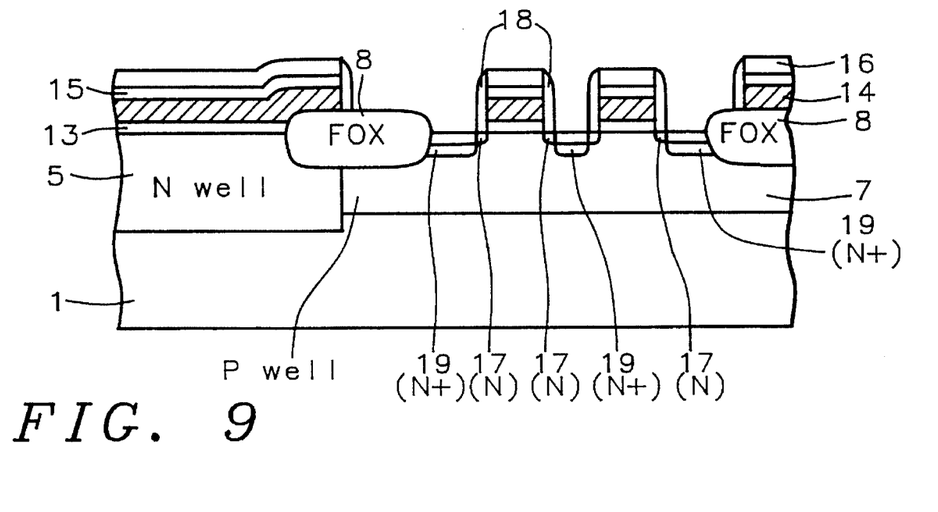

After photoresist removal, using a oxygen plasma ash, followed by screen oxide removal, via a buffered hydrofluoric acid solution, and careful chemical cleans, a gate oxide, 13, is thermally grown at a temperature between about 850° to 950° C., to a thickness between about 60 to 200 Angstroms. A polysilicon layer, 14, is then grown via LPCVD processing, using in-situ doping using PH3, at a temperature between about 550° to 650° C. to a thickness between about 1000 to 4000 Angstroms. A thin silicon dioxide layer, 15, is thermally grown at a temperature between about 800° to 900° C., to a thickness between 30 to 60 Angstroms, followed by a phoshosilicate, (PSG), deposition, using LPCVD processing, at a temperature between about 600° to 800° C., to a thickness between about 1500 to 2500 Angstroms, with the PSG layer, 16, containing between about 2 to 6% P2O5. Patterning of the polysilicon gate structure, used for the N channel devices, is next performed using conventional photoresist techniques, and RIE, using CHF3 for the insulator material, while Cl2 or HBr is used to pattern the polysilicon material. After photoresist removal, the resulting structures can be seen in FIG. 7. It should be noted that the polysilicon gate structures, to be used for the P channel devices, have not yet been formed. This aspect of the split polysilicon gate process, will allow source and drain processing, for both N channel as well as P channel devices, to be performed without costly photoresist masking procedures. FIGS. 8–9, schematically describe the processing used to create the lightly doped, (LDD), and standard source and drain regions. First a phosphorous ion implant, at an energy between about 30 to 70 Kev., at a dose between about 1E13 to 1E14 atoms/cm2, is used to create LDD areas, 17, in the P well region, 7. It can be seen that photoresist masking was not needed since the silicon to be used for the P channel devices, in the N well region, 5, is protected from the implant process by PSG and polysilicon layers. An LPCVD deposition of silicon oxide, using tetraethylorthosilicate, (TEOS), as a source material, is performed to a thickness between about 1000 to 3000 Angstroms, followed by a blanket anisotropic RIE procedure, using CHF3, to form insulator spacer, 18. Another ion implant procedure, again performed without photoresist masking, is carried out using arsenic, and/or phosphorous, at an energy between about 30 to 100 Kev., at a dose between about 1E15 to 5E15 atoms/cm2, to create N+ source and drain area 19, in the P well region.

Figure 10:
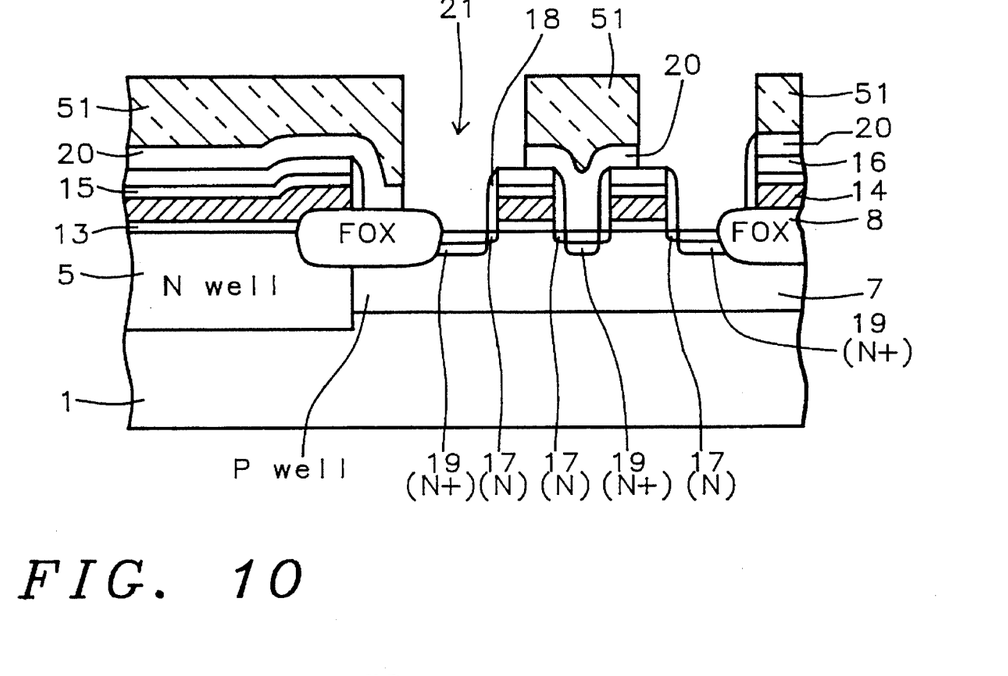
FIGS. 10–11, which again in cross-sectional style, schematically show the formation of the storage node.
Figure 11:
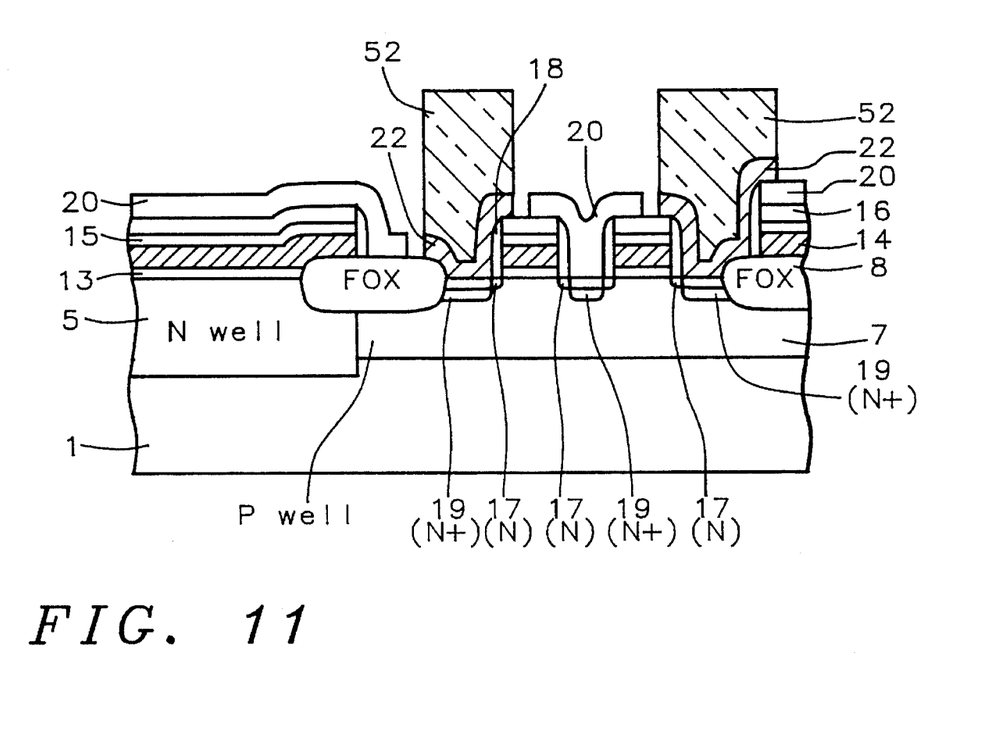
Figure 12:
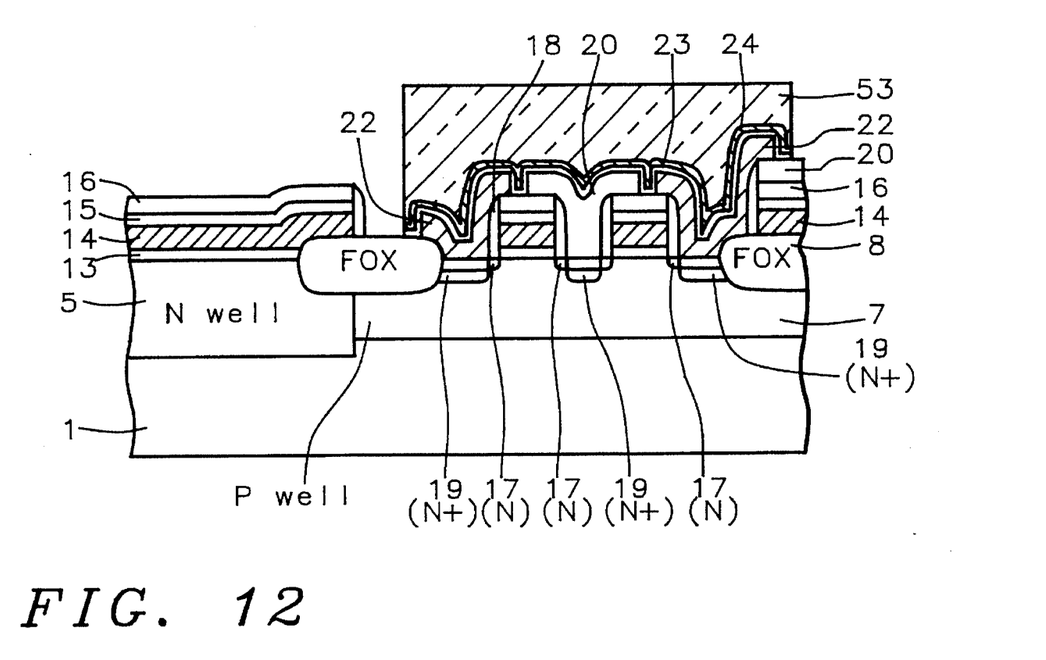
FIGS. 12 . 15, which schematically in cross-sectional representation, shows the formation of the capacitor plate, as well as the formation of the P channel polysilicon gate structure.

The storage node contact hole etch process is next addressed. A thin layer of TEOS insulator, 20, is deposited using LPCVD techniques to a thickness between about 750 to 2500 Angstroms. A critical photoresist image, 51, is applied to open area, 21, in the P well region, shown in FIG. 10. This is accomplished with RIE processing using CHF3. It can be seen that opening 21, will allow a self-aligned storage node contact to be achieved. After photoresist removal, via oxygen plasma ashing, followed by careful wet cleans, another layer of polysilicon, 22, is grown using LPCVD, using an undoped layer of a thickness between about 1000 to 3500 Angstroms, followed by an PH3 in-situ doped layer , a thickness between about 1500 to 3500 Angstroms. The polysilicon is then patterned using standard photoresist images, 52, and RIE processing using SF6 and Cl2, to produce the storage node contact, 22, self aligned to the adjacent polysilicon gate structure, 14. This can be seen in FIG. 11. After photoresist removal, again using an O2 plasma ash, and careful wet cleans, an interlevel dielectric, 23, is created. This insulator, made of silicon Oxide—silicon Nitride—silicon Oxynitride, is referred to as ONO. It is obtained by first thermal oxidation of polysilicon layer, 22, at a temperature between about 850° to 950° C., to a thickness between about 40 to 80 Angstroms. Next a thin layer of silicon nitride is grown using LPCVD, at a temperature between about 700° to 800° C., to a thickness between about 50 to 100 Angstroms. Finally an oxidation at a temperature between about 900° to 950° C., is performed to convert a portion of the silicon nitride layer to siliconoxynitride to a thickness between about 20 to 50 Angstroms. A thin layer of amorphous silicon, 24, is then deposited at a temperature between about 525° to 575° C., to a thickness between about 300 to 700 Angstroms, using LFCVD. Patterning of the composite amorphous Si, 24, —ONO, 23, —storage node contact dielectric mask, 20, is accomplished via standard photoresist, 53, and RIE processes, using CHF3, for the ONO layer, and SF6—Cl2, for the polysilicon films, and CHF3 again for removal of TEOS oxide layer, 20, in the N well region, 5. This is shown in FIG. 12.

Figure 13:
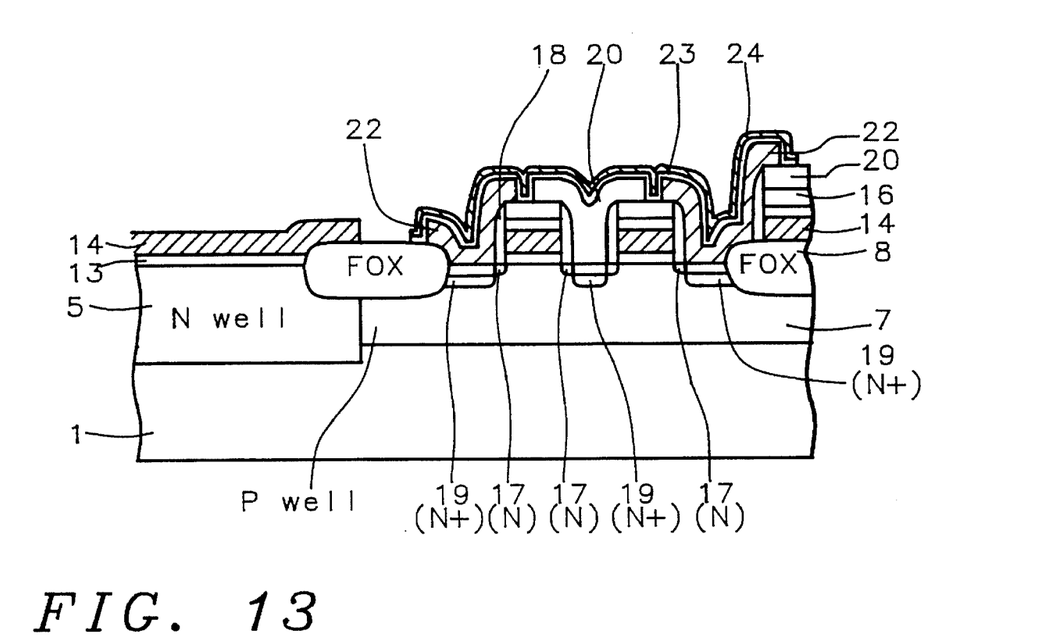
Figure 14:
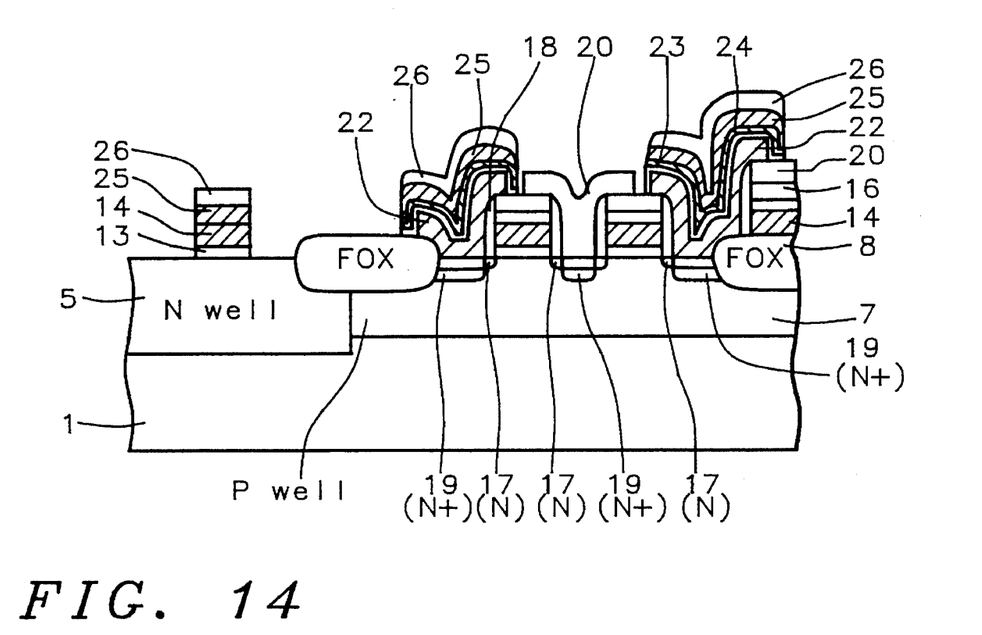

FIG. 13, shows the DRAM device after photoresist removal, again via O2 plasma ashing, a wet chemical clean, and the wet removal of PSG layer, 16, as well as the removal of oxide layer, 15, from polysilicon layer, 14, in the N well region, 5. The PSG removal was acccomplished using ammonia peroxide, while oxide layer 15 was removed via use of dilute hydroflouric acid. Next a layer of polysilicon, 25, is grown using LPCVD, using in-situ $PH_3$ doping processing, at a temperature between about 525° to 650° C., to a thickness between about 750 to 1250 Angstroms. A layer of TEOS deposited silicon oxide, 26, is deposited on polysilicon layer 25, at a temperature between about 525° to 625° C., to a thickness between about 500 to 1500 Angstroms, using LPCVD. Patterning is next performed to define the capacitor plate, in the P well region, 7, while the same patterning process results in the creation of the polysilicon gate structure, in the N well region, 5. The patterning is accomplished using standard photoresist procedures, followed by RIE using CHF3 for the TEOS insulator, 26, while SF6 and Cl2, or HBr were used to etch polysilicon layer, 25, for the capacitor plate structure, and an overetch in SF6 and Cl2 allowed polysilicon layer 25, and polysilicon layer 14, to be patterned into the polysilicon gate structure in the N well region. It can again be seen that the split polysilicon process allowed both the capacitor plate, as well as the polysilicon gate structure, to be obtained in a single etch step. This structure is shown schematically in FIG. 14, after photoresist removal via O2 plasma ashing.

Figure 15:
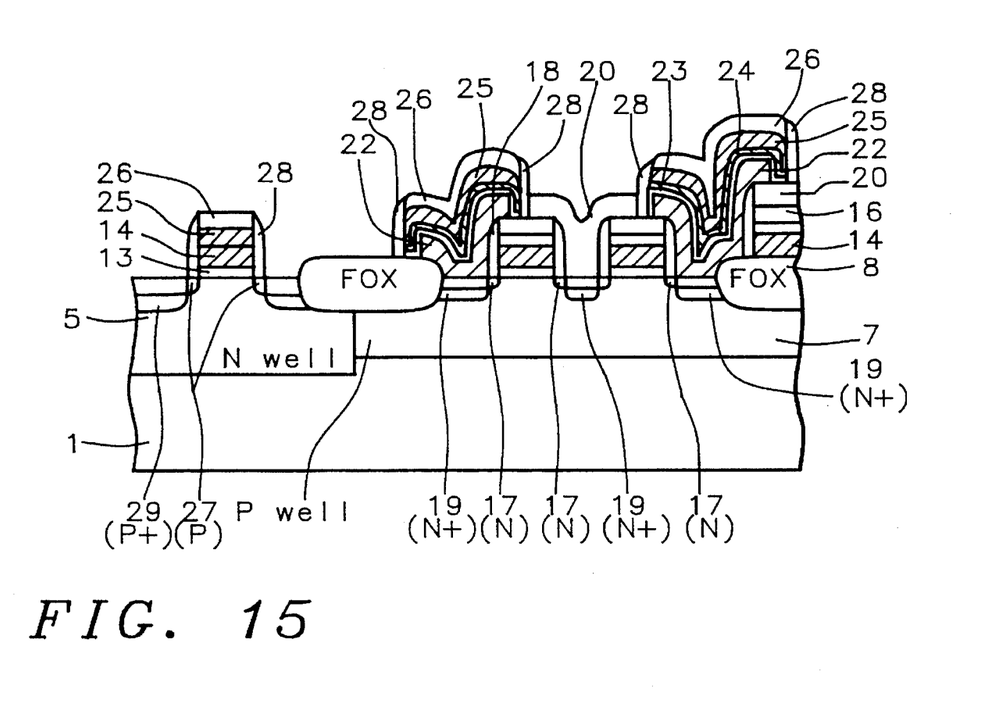
Figure 16:
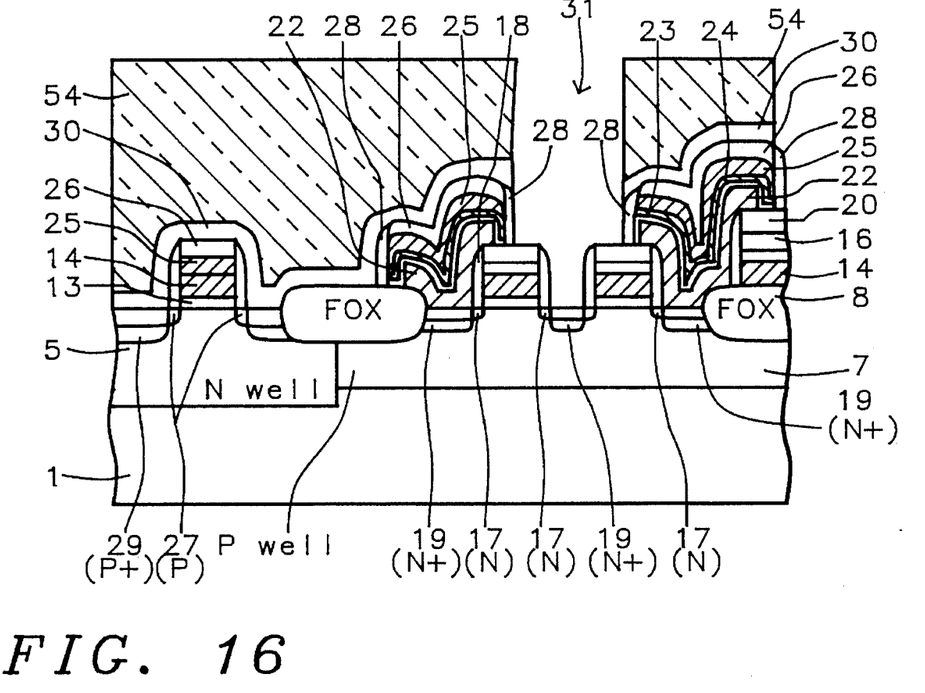
FIGS. 16–17, which schematically, in cross-sectional representation, describe the bit line contact structure process.
Figure 17:
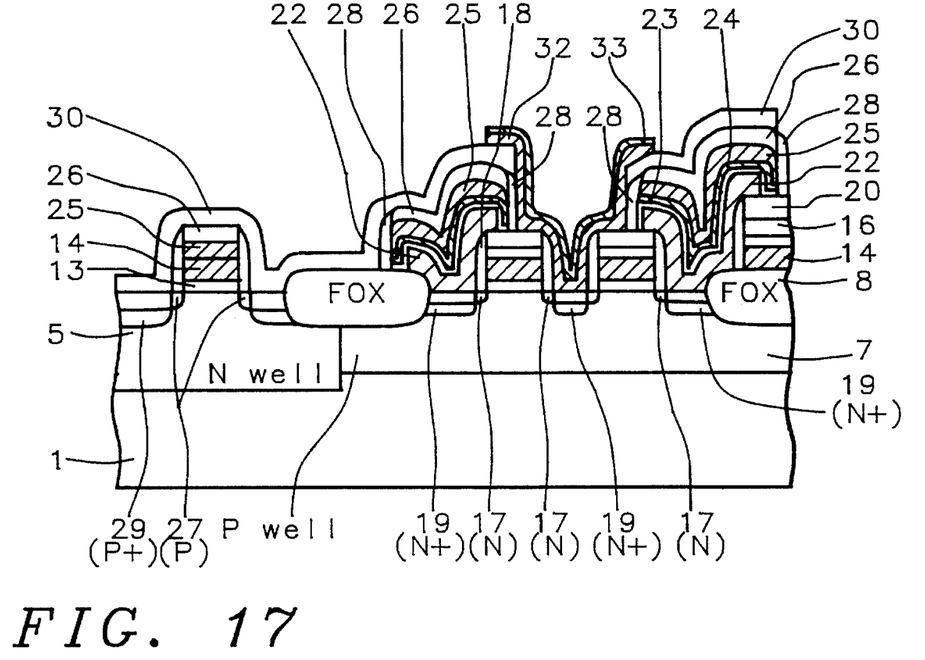

FIG. 15, illustrates the creation of the P type LDD, and source and drain areas, needed to fabricate the P channel devices, in the N well region, 5. First the LDD, 27, is formed via ion implantation of B11 or BF2 at an energy between about 30 to 50 Kev., at a dose between about 1E13 to 1E14 atoms/cm2. Next a TEOS oxide is grown to a thickness between about 1000 to 3000 Angstroms, and subjected to a anisotropic RIE process, used to create insulator spacer, 28. Next the source and drain areas, 29, are formed via ion implantation of BF2, at an energy between about 30 to 60 Kev., at a dose between about 1E15 to 5E15 atoms/cm2. It should be noted that the creation of these regions were again accomplished without the use of photolithographic masking. The bit line contact hole process is next addressed by first depositing a layer of TEOS oxide, 30, to a thickness between about 5000 to 6000 Angstroms, and opening a contact hole to diffused area, 19, in the P well region, 7. The bit line contact hole, 31, is arrived at with photoresist image, 54, and RIE using CHF3 to etch TEOS layers 30, and 20. It can be seen that the photolitography is designed to allow a self-aligned bit line contact to be produced. This can be seen in FIG. 16. After photoresist removal, via O2 plasma ashing, and careful wet cleans, another layer of in-situ PH$_3$ doped polysilicon, 32, is grown using LPCVD, at a temperature between about 525° to 650° C., to a thickness between about 500 to 1000 Angstroms. A layer of tungsten silicide, 33, is deposited, again using LPCVD, to a thickness between about 1000 to 2000 Angstroms. Standard photolithographic and RIE procedures are used to define the tungsten silcide—polysilicon, (polycide), bit contact structure, shown in FIG. 17. Photoresist removal again was accomplished using O2 plasma ashing.

Figure 18:
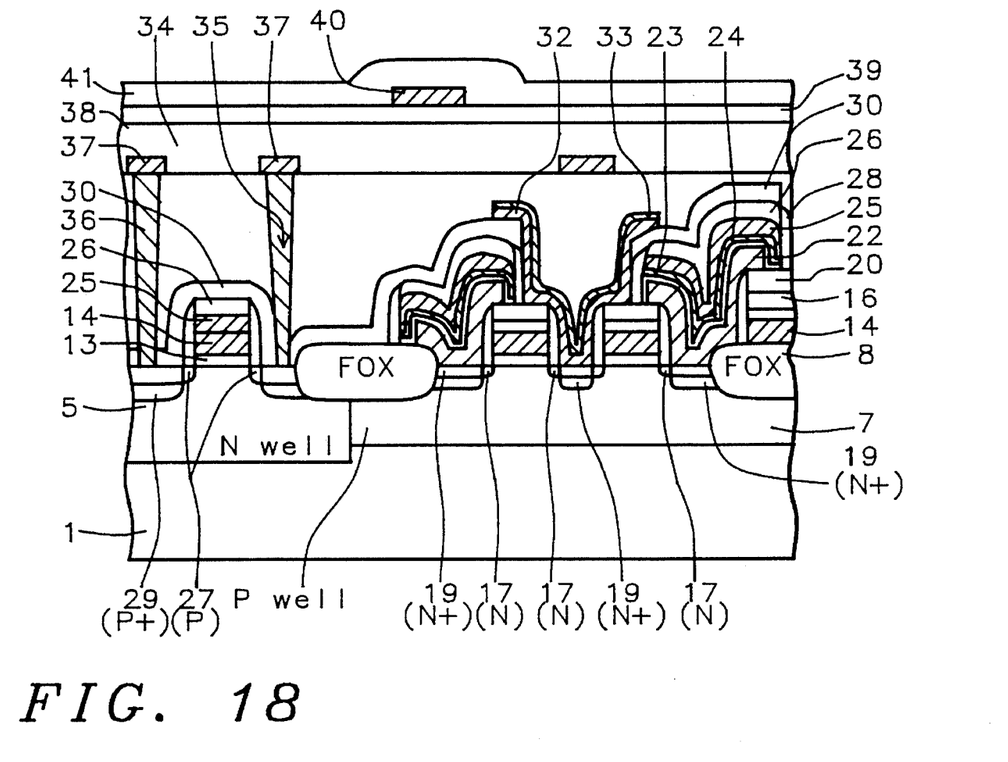
FIGS. 18–19, which schematically, in cross-sectional representation, illustrate the metallization and passivation structures used for this DRAM device.
Figure 19:
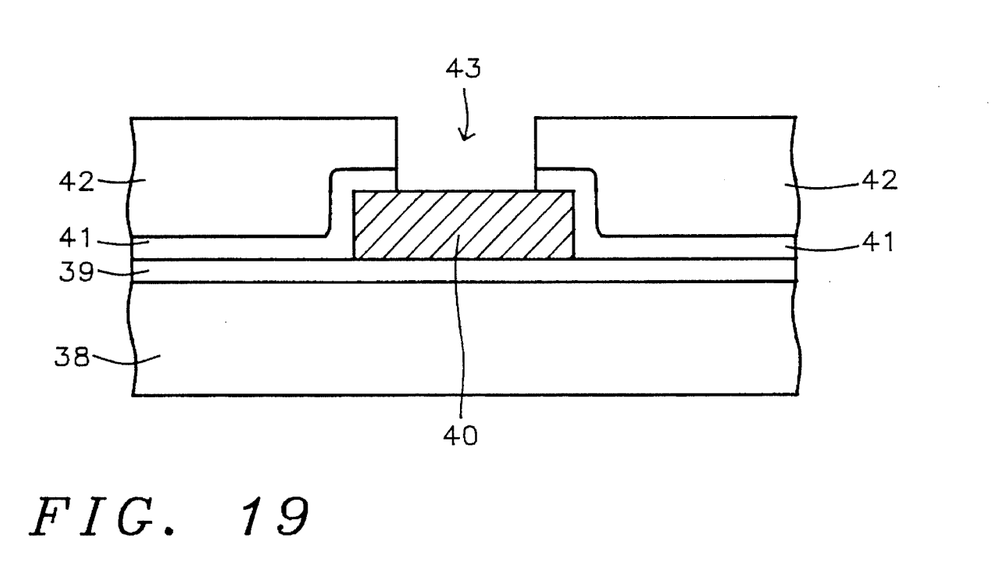

Metallization and passivation, needed to complete the stacked capacitor DRAM, are shown in FIG. 18. Briefly, a first interlevel dielectric, (ILD-1), 34 of boro-phospho-silicate glass, (BPSG), is deposited using plasma enhanced chemical vapor deposition, (PECVD), or LPCVD, to a thickness between about 4000 to 15000 Angstroms, followed by a N2 anneal at a temperature between about 800° to 900° C. Chemical—mechanical polishing, (CMP), is used to create the smooth topogology of ILD-1, necessary for subsequent planar metallization and passsivation processes. A contact hole, 35, is formed in ILD-1, via standard photolithographic processes and RIE, using CHF3 to create the contact hole in ILD-1. After photoresist removal and careful wet cleans, an r.f. sputter deposition of TiN—tungsten is carried out, completely filling contact hole, 35. CMP is again used to remove unwanted TiN—tungsten from the surface of ILD-1, resulting in contact stud, 36. A deposition of Al—Cu, using standard sputtering techniques, to a thickness between about 4000 to 8000 Angstroms, is next performed, and followed by conventional photolithographic and Cl2, RIE processing, to create the M1 structure, 37, shown in FIG. 18. A second interlevel dielectric, (ILD-2), 38, is next deposited using processing identical to processing used for ILD-1. Again CMP is employed to planarize the ILD-2 layer. A critical layer of silicon nitride, 39, is next deposited, on the planarized IDL-2 layer, using PECVD at a temperature between about 200° to 400° C. to a thickness between about 5000 to 10000 Angstroms, creating a composite dielectric layer. The silicon nitride overlay is needed to insure against interlevel leakage and shorts that can arise between metal levels. Via hole openings in the composite, to M1, (not shown in FIG. 18), are made, again using standard photolithographic and RIE processing. A metal deposition of Al—Cu is next performed, contacting M1 in the interlevel via, (not shown in FIG. 18), and overlying composite ILD-2. Photolithographic and RIE processing then create M2 structure, 40. Finally FIG. 19 indicates the passivation of the M2 structure, 40, with a PECVD deposition of silicon oxides, 41, and a coating of polyimide, 42. Bonding pads, 43, to the M2 structure, 40, are made again using standard photolithographic and RIE processing.

While this invention has been particularly shown and described with reference to, the preferred embodiments thereof, it will be understood by those skilled in the art that various changes in form and detail may be made without departing from the spirit and scope of this invention.

What is claimed is:

1. A method of fabricating stacked capacitor, dynamic random access memory, (DRAM), devices, on a semiconductor substrate, comprising the steps of:

ion implanting first conductivity imparting dopants into portions of said semiconddctor substrate, to form N well region;

ion imnplanting second conductivity imparting dopants into other portions of said semiconductor substrate, to form P well region;

forming a field oxide region in said semiconductor substrate, between said N well region, and said P well region;

ion implanting a third conductivity imparting dopant into said P well region, and said N well region;

ion implanting a fourth conductivity imparting dopant into said P well region;

growing a gate oxide on said P well region, and said N well region;

depositing a first polysilicon layer on said gate oxide, and on said field oxide region;

growing a first oxide layer on said first polysilicon layer;

depositing a phosphosilicate doped oxide layer on said first oxide layer;

patterning of said phosphosilicate doped oxide layer, said first oxide layer, and said first polysilicon layer, to form N channel polysilicon gate structures, in said P well region, while leaving said phosphosilicate doped oxide layer, said first oxide layer, and said first polysilicon layer, undisturbed in said N well region;

ion implanting a fifth conductivity imparting dopant into areas of said P well region, not covered by said N channel polysilicon gate structures;

depositing a first insulator layer;

anisotropic etching of said first insulator layer to produce insulator spaces on said sidewalls of said N channel polysilicon gate structures;

ion implanting a sixth conductivity imparting dopant into areas of said P well region, not covered by said N channel polysilicon gate structures;

depositing a second insulator layer;

opening holes in said second insulator layer to areas in said P well region, between said field oxide region, and said N channel polysilicon gate structures;

depositing a second polysilicon layer;

patterning of said second polysilicon layer to form structure that completely covers area in said P well region, between said field oxide region and said N channel polysilicon gate structures;

depositing a composite dielectric layer;

depositing an amorphous silicon layer on said composite dielectric layer;

patterning to remove said amorphous silicon layer, and said composite dielectric layer, formed over said phosphosilicate doped oxide layer in said N well region;

removal of said phosphosilicate doped oxide layer formed over said first polysilicon layer, in said N well region;

depositing a third polysilicon layer;

depositing a third insulator layer on said third polysilicon layer;

patterning of said third insulator layer, of said third polysilicon layer, and of said first polysilicon layer, to form P channel polysilicon gate structures in said N well region, while removing said third insulator layer, and said third polysilicon layer from all regions in said P well region, except from a structure, of said amorphous silicon layer, said composite dielectric insulator, and said second polysilicon layer;

ion implanting a seventh conductivity imparting dopant into areas of said N well region, not covered by said P channel polysilicon gate structures;

depositing a fourth insulator layer;

anisotropic etching of said fourth insulator layer, to produce insulator spacers on sidewalls of said P channel polysilicon gate structures;

ion implanting an eight conductivity imparting dopant into areas of said N well region, not covered by said P channel polysilicon gate structures;

depositing a fifth insulator layer;

opening holes in said fifth insulator layer to areas of said P well region, between said N channel polysilicon gate structures;

depositing a fourth polysilicon layer;

depositing a metal silicide on said fourth polysilicon layer;

patterning to remove said metal silicide layer, and said fourth polysilicon layer from all areas except from said holes in said fifth insulator layer;

depositing a first interlevel dielectric layer;

planarizing said first interlevel dielectric layer;

opening holes in said first interlevel dielectric layer, to areas of said N well region, not covered by said P channel polysilicon gate structures;

depositing a stud metal layer;

removal of said stud metal layer from all areas except from said holes, in said first interlevel dielectric layer;

depositing a first metal layer;

patterning of said first metal layer to form first metal structure;

depositing a second interlevel dielectric layer;

planarizing said second interlevel dielectric layer;

depositing a second silicon nitride layer, on said second intrelevel dielectric layer;

opening holes in said silicon nitride layer, and in said second interlevel dielectric layer, to regions of said first metal structure;

depositing a second metal layer; and patterning of said second metal layer to form second metal structure.

2. The method of claim 1, wherein said first conductivity imparting dopants, used to form said N well region, are arsenic, ion implanted at an energy between about 50 to 180 Kev., at a dose between about 1E11 to 1E13 atoms/cm2, and phosphorous, ion implanted at an energy between about 100 to 400 Kev., at a dose between about 1E11 to 1E13 atoms/cm2.

3. The method of claim 1, wherein said second conductivity imparting dopant, used to form said P well region, is boron, ion implanted at an energy between about 10 to 100 Kev., at a dose between about 1E12 to 1E13 atoms/cm2.

4. The method of claim 1, wherein said first polysilicon layer is grown using LPCVD processing, at a temperature between about 550° to 650° C., to a thickness between about 1000 to 4000 Angstroms, and is in-situ doped using PH3.

5. The method of claim 1, wherein said open holes, in said second insulator layer, are formed with a RIE process to remove said second insulator layer from area between said N channel polysilicon structures, and said field oxide region, in said P well region.

6. The method of claim 1, wherein said second polysilicon layer is grown using LPCVD processing, using an undoped, bottom layer, at a thickness between about 1000 to 3500 Angstroms, and an overlying layer of PH3 in-situ doped, polysilicon, to a thickness between about 1500 to 3500 Angstroms.

7. The method of claim 1, wherein said composite dielectric layer is composed of: a layer of thermally grown siliocn dioxide, obtained via oxidation of said second polysilicon layer, to a thickness between about 40 to 80 Angstroms; a first silicon nitride layer, obtained via LPCVD processing, to a thickness between about 50 to 100 Angstrom,; and a layer of silicon oxynitride, obtained by oxidation of said first silicon nitride layer, to a thickness between about 20 to 50 Angstroms.

8. The method of claim 1, wherein said third polysilicon layer is grown using LPCVD processing, at a temperature between about 525° to 650° C., to, a thickness between about 750 to 1250 Angstroms, and is in-situ doped using PH3.

9. The method of claim 1, wherein said open holes in said fifth insulator layer, are formed with a RIE process to remove said fifth insulator layer from an area between said N channel polysilicon structures, in said P well region.

10. The method of claim 1, wherein said fourth polysilicon layer is grown using LPCVD processing, at a temperature between about 525° to 650° C., to a thickness between about 500 to 1000 Angstroms, and is in-situ doped using PH3.

11. The method of claim 1, wherein said metal silicide is tungsten silicide, deposited using LPCVD processing, to a thickness between about 1000 to 2000.

12. The method of claim 1, wherein said second silicon nitride layer, deposited on said second interlevel dielectric layer, is grown using PECVD processing, at a temperature between about 200° to 400° C., to a thickness between about 5000 to 10000 Angstroms.

13. A method of fabricating stacked capacitor, DRAM devices, on a semiconductor substrate, using a split polysilicon process, and self aligned storge node, and bit line structures, comprising the steps of:

forming a N well region in said semiconductor substrate., via ion implantation of a first conductivity imparting dopant;

forming a P well region in said semiconductor substrate, via ion implantation of a second conductivity imparting dopant, forming a field oxide region in said semiconductor substrate, between said N well region, and said P well region, ion implanting a third conductivity imparting dopant into said P well region, and into said N well region for threshold voltage adjustment, ion implanting a fourth conductivity imparting dopant into said P well region growing a gate oxide on said N well region, and on said P well region, depositing a first polysilicon layer on said gate oxide, and on said field oxide region, growing a first oxide layer on said first polysilicon layer;

depositing a phosphosilicate doped oxide layer on said first oxide layer;

patterning of said phosphosilicate doped oxide layer, said first oxide layer, and said first polysilicon layer, to form N channel polysilicon gate structures, in said P well region, while leaving said phosphosilicate doped oxide layer, said first oxide layer; and said first polysilicon layer, undisturbed in said N well region;

ion implanting a fifth conductivity imparting dopant into areas of said P well region, not covered by said N channel polysilicon gate structures, to form lightly doped, N type, source and drain regions;

depositing a first insulator layer;

anisotropic etching of said first insulator layer to form insulator spacers on sidewalls of said N channel polysilicon gate structures;

ion implanting a sixth conductivity imparting dopant into areas of said P well region, not covered by said N channel polysilicon gate structures, to form N+ source and drain regions;

depositing a second insulator layer;

opening holes to create storage node contact hole, in said second insulator layer, to areas in said P well region, between said field oxide region and said N channel polysilicon gate structures;

depositing a second polysilicon layer;

patterning said second polysilicon layer, to form storage node contact structure, completely covering said storage node contact hole;

depositing a composite dielectric layer;

depositing an amorphous silicon layer on said composite dielectric layer;

patterning to remove said amorphous silicon layer, and composite dielectric layer, formed over said phosphosilicate doped oxide layer in said N well region;

removal of said phosphosilicate doped oxide layer formed over said first polysilicon layer, in said N well region;

depositing a third polysilicon layer;

depositing a third insulator layer on said third polysilicon layer;

patterning of said third insulator layer, of said third polysilicon layer, and of said first polysilicon layer, to form P channel polysilicon gate structures in said N well region, while patterning said third insulator layer and third polysilicon layer, to form capacitor plate for storage node capacitor structure, in said P well region;

ion implanting a seventh conductivity imparting dopant into areas of said N well region, not covered by said P channel polysilicon gate structures, to form lightly doped, P type, source and drain regions;

depositing a fourth insulator layer;

anisotropic etching of said fourth insulator layer, to produce insulator spacers on sidewalls of said P channel polysilicon gate structures;

ion implanting an eight conductivity imparting dopant into areas of said N well region, not covered by said P channel polysilicon gate structures, to form P+ source and drain felons;

depositing a fifth insulator layer;

opening holes in said fifth insulator layer, to areas of said P well region, between said N channel polysilicon gate structures, to form bit contact hole;

depositing a fourth polysilicon layer;

depositing a tungsten silicide layer on said fourth polysilicon layer;

patterning said tungsten silicide layer, and said fourth polysilicon layer, to form bit contact structure, in said bit contact hole, in said P well region;

depositing a first interlevel dielectric layer;

planarizing said first interlevel dielectric layer;

opening holes in said first interlevel dielectric layer, to said P+ source and drain regions;

depositing a stud metal layer;

planarizing said stud metal layer, to leave said stud metal layer only in said holes in said first interlevel dielctric layer;

depositing a first metal layer;

patterning said first metal layer to form first metal structure, contacting said stud metal layer;

depositing a second interlevel dielectric layer;

planarizing said second interlevel dielectric layer;

depositing a second silicon nitride layer on said second interlevel dielectric layer;

opening holes in said second silicon nitride layer, and in said second interlevel dielectric layer, to regions of said first metal structure;

depositing a second metal layer; and patterning of said second metal layer to form second metal structure.

14. The method of claim 13, wherein said first conductivity imparting dopants, used to form said N well region, are arsenic, ion implanted at an energy between about 50 to 120 Kev., at a dose between about 1E11 to 1E13 atoms/cm2, and phosphorous, ion implanted at an energy between about 100 to 400 Kev., at a dose between about 1E11 to 1E13 atoms/cm2.

15. The method of claim 13, wherein said second conductivity imparting dopant, used to form said P well region, is boron, ion implanted at an energy between about 10 to 100 Kev., at dose between about 1E12 to 1E13 atoms/cm2.

16. The method of claim 13, wherein said first polysilicon layer is grown using LPCVD processing, at a temperature between about 550° to 650° C., to a thickness between about 1000 to 4000 Angstroms, and is grown using PH3 in-situ doping.

17. The method of claim 13, wherein said storage node contact hole is opened in said second insulator layer with a RIE process, in said P well region, in an area between said N channel polysilicon gate structures and said field oxide region.

18. The method of claim 13, wherein said second polysilicon layer, used as the bottom layer for said storage node contact structure, is grown by depositing a LPCVD layer of undoped polysilicon, to a thickness between about 1000 to 3500 Angstroms, followed by a LPCVD layer of PH3 in-situ doped polysilicon, to a thickness between about 1500 to 3500 Angstroms.

19. The method of claim 13, wherein said composite dielectric layer is composed of: a layer of thermally grown silicon dioxide, obtained via oxidation of said second polysilicon layer, to a thickness between about 45 to 80 Angstroms; a first layer of silicon nitride, obtained via LPCVD processing, to a thickness between about 50 to 100 Angstroms; and a layer of silicon oxynitride, obtained by oxidation of said first silicon nitride layer, to a thickness between about 20 to 50 Angstroms.

20. The method of claim 13, wherein said third polysilicon layer, used for said capacitor plate for said storage node capacitor structure, is grown using LPCVD processing, at a temperature between about 525° to 650° C., to a thickness between about 750 to 1250 Angstroms, and is in-situ doped using PH3.

21. The method of claim 13, wherein said bit contact holes are opened with a RIE process in said fifth insulator layer, in said P well region, between said N channel polysilicon gate structures.

22. The method of claim 13, wherein said fourth polysilicon layer, used for said bit contact structure, is grown using LPCVD processing, at a temperature between about 525° to 650° C., to a thickness between about 500 to 1250 Angstroms, and is in-situ doped using PH3.

23. The method of claim 13, wherein said tungsten silicide is deposited using LPCVD processing, to a thickness between about 1000 to 8000 Angstroms.

24. The method of claim 13, wherein said second silicon nitride layer, deposited on said second interlevel dielectric layer, is grown using PECVD processing, at a temperature between about 200° to 400° C., to a thickness between about 5000 to 10000 Angstroms.

* * * * *